(12) United States Patent
Tanioka

(10) Patent No.: US 11,152,345 B2
(45) Date of Patent: Oct. 19, 2021

(54) METHOD FOR MANUFACTURING SEMICONDUCTOR DEVICE

(71) Applicant: Kioxia Corporation, Minato-ku (JP)

(72) Inventor: Kizashi Tanioka, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/798,797

(22) Filed: Feb. 24, 2020

(65) Prior Publication Data

US 2021/0082900 A1 Mar. 18, 2021

(30) Foreign Application Priority Data

Sep. 13, 2019 (JP) .............................. JP2019-167318

(51) Int. Cl.
| | | |
|---|---|---|
| *H01L 21/768* | (2006.01) | |
| *H01L 25/00* | (2006.01) | |
| *H01L 25/18* | (2006.01) | |
| *H01L 23/00* | (2006.01) | |
| *H01L 21/78* | (2006.01) | |
| *H01L 21/304* | (2006.01) | |

(52) U.S. Cl.
CPC .............. *H01L 25/50* (2013.01); *H01L 21/78* (2013.01); *H01L 24/80* (2013.01); *H01L 25/18* (2013.01); *H01L 21/3043* (2013.01); *H01L 2924/3511* (2013.01)

(58) Field of Classification Search
CPC ....... H01L 2224/94; H01L 2224/80001; H01L 2224/08145
See application file for complete search history.

(56) References Cited

U.S. PATENT DOCUMENTS

| | | | |
|---|---|---|---|
| 4,638,552 A | | 1/1987 | Shimbo et al. |
| 4,962,062 A | * | 10/1990 | Uchiyama ............. H01L 21/187 |
| | | | 148/DIG. 12 |
| 7,514,291 B2 | | 4/2009 | Akram |
| 9,058,972 B2 | | 6/2015 | Yoshihara et al. |
| 9,941,321 B2 | | 4/2018 | Matsugai et al. |
| 10,115,681 B1 | * | 10/2018 | Ariyoshi ........... H01L 27/11524 |
| 10,283,493 B1 | * | 5/2019 | Nishida ............. H01L 27/11582 |
| 10,727,216 B1 | * | 7/2020 | Kai ...................... H01L 25/0657 |
| 2003/0232488 A1 | * | 12/2003 | Chua .................... H01L 23/481 |
| | | | 438/460 |

(Continued)

FOREIGN PATENT DOCUMENTS

WO WO 2014/024611 A1 2/2014

*Primary Examiner* — Anthony Ho
*Assistant Examiner* — David J Goodwin
(74) *Attorney, Agent, or Firm* — Oblon, McClelland, Maier & Neustadt, L.L.P.

(57) ABSTRACT

According to an embodiment, a method for manufacturing a semiconductor device includes forming a slit in a first wafer in which a first semiconductor layer is formed on a first substrate, sticking together the first wafer in which the slit is formed and a second wafer in which a second semiconductor layer is formed on a second substrate, the sticking being performed between a side of the first semiconductor layer and a side of the second semiconductor layer, thinning the first substrate or the second substrate of a member obtained by the sticking, forming an interconnection on a face of the substrate that is thinned, and dicing a member on which the interconnection is formed in accordance with a position of the slit.

20 Claims, 11 Drawing Sheets

(56) References Cited

U.S. PATENT DOCUMENTS

| | | |
|---|---|---|
| 2008/0251826 A1 | 10/2008 | Lee et al. |
| 2014/0027927 A1* | 1/2014 | Reinmuth ............. H01L 23/481 257/774 |
| 2015/0294963 A1* | 10/2015 | Lin ................... H01L 21/76897 438/107 |
| 2016/0009544 A1* | 1/2016 | Rothberg ............. B81B 3/0021 257/737 |
| 2016/0013154 A1* | 1/2016 | Ma ....................... H01L 21/563 257/777 |
| 2020/0075533 A1* | 3/2020 | Gao ........................ H01L 24/06 |
| 2020/0091124 A1* | 3/2020 | Liao ........................ H01L 25/18 |
| 2020/0286876 A1* | 9/2020 | Nakaki ................... H01L 24/80 |
| 2020/0286990 A1* | 9/2020 | Uchiyama ......... H01L 21/76275 |
| 2020/0335516 A1* | 10/2020 | Rajashekhar ..... H01L 27/11573 |

* cited by examiner

METHOD FOR MANUFACTURING SEMICONDUCTOR DEVICE

CROSS-REFERENCE TO RELATED APPLICATION

This application is based upon and claims the benefit of priority from Japanese Patent Application No. 2019-167318, filed on Sep. 13, 2019, the entire contents of which are incorporated herein by reference.

FIELD

Embodiments described herein relate generally to a method for manufacturing a semiconductor device.

BACKGROUND

A conventional method for manufacturing a thin semiconductor device includes sticking two wafers together, where one wafer has a semiconductor device layer formed on one main surface of a semiconductor substrate and the other wafer has another semiconductor device layer formed on a semiconductor substrate, followed by grinding the semiconductor substrate from the other main surface of the substrate to make the substrate thinner, and dicing the wafers into chips.

DETAILED DESCRIPTION

Figure 1:
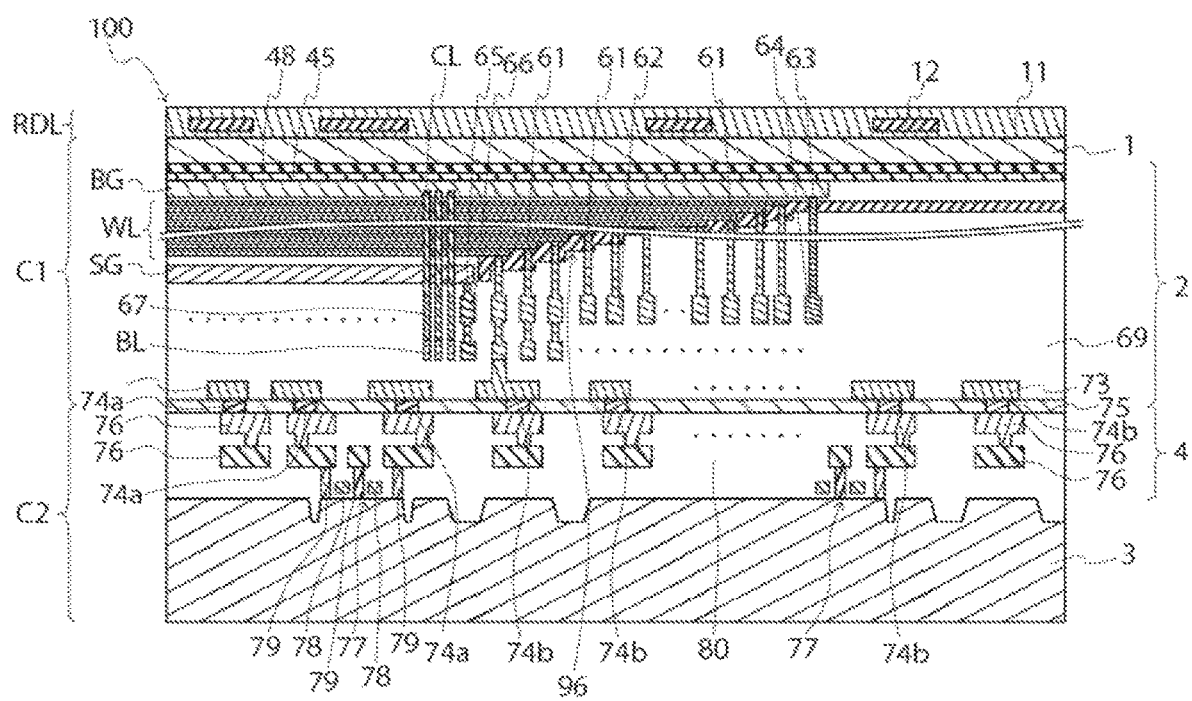
FIG. 1 is a cross-sectional view of a semiconductor device according to an embodiment.

According to an embodiment, a method for manufacturing a semiconductor device includes forming a slit in a first wafer in which a first semiconductor layer is formed on a first substrate, sticking together the first wafer in which the slit is formed and a second wafer in which a second semiconductor layer is formed on a second substrate, the sticking being performed between a side of the first semiconductor layer and a side of the second semiconductor layer, thinning the first substrate or the second substrate of a member obtained by the sticking, forming an interconnection on a face of the substrate that is thinned, and dicing a member on which the interconnection is formed in accordance with a position of the slit.

Some elements are herein given a plurality of exemplary expressions. Note that these expressions are merely examples and do not hinder the elements from being expressed in other wars. Also note that elements not given a plurality of expressions may be expressed by other expressions.

The drawings are made schematically, and the relationship between a thickness and a plan view dimension, the ratio among layer thicknesses, and so on may be different from actual ones. The drawings may include portions in which the dimensional relationships and ratios are different from one another. Some reference symbols may be omitted in the drawings.

First Embodiment

Figure 2:
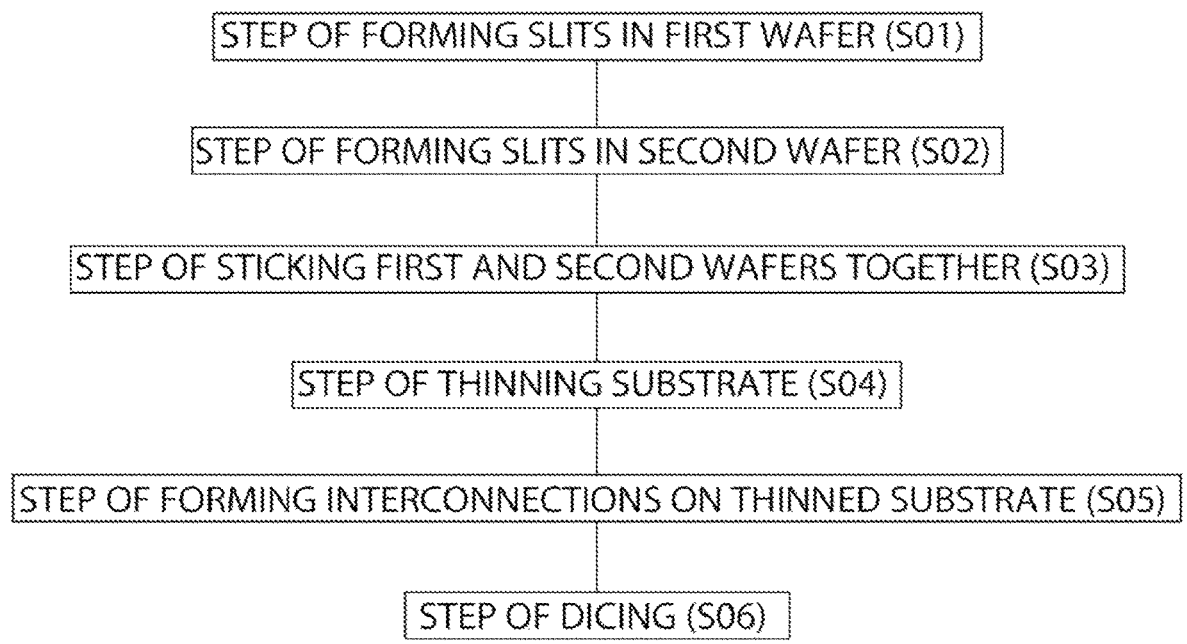
FIG. 2 is a flowchart for a semiconductor device according to an embodiment.

A first embodiment relates to a method for manufacturing a semiconductor device. FIG. 1 is a cross-sectional view of a semiconductor device 100. FIG. 2 is a flowchart illustrating the method for manufacturing the semiconductor device 100 according to the first embodiment. FIGS. 3 to 9 are process step cross-sectional views of the semiconductor device 100. The semiconductor device 100 is, more specifically, a memory device such as a NAND flash memory chip.

The cross-sectional view in FIG. 1 shows a main portion of part of the semiconductor device 100. The semiconductor device 100 in FIG. 1 is an example of a memory device. The semiconductor device 100 is manufactured by the method for manufacturing the semiconductor device 100 according to the embodiment. The semiconductor device 110 includes a first chip C1, a second chip C2, and a redistribution layer RDL. A configuration of the semiconductor device 100 will now be described; however, the method for manufacturing the semiconductor device 100 can be implemented without being limited to the semiconductor device 100 configured to include a first semiconductor layer 2 and a second semiconductor layer 4.

The first chip C1 includes a first substrate 1 and a first semiconductor layer 2. The first semiconductor layer 2 is disposed on a face of the first substrate 1, the face facing toward a second semiconductor layer 4. The first chip C1 is a chip resulting from dicing a first wafer W1. The first substrate 1 is, for example, an Si substrate. The first semiconductor layer 2 includes a memory cell array that includes a plurality of memory cells. At an end of the memory cell array region where the plurality of memory cells is disposed, a staircase structure 96 of electrode layers WL is formed.

The second chip C2 includes a second substrate 3 and a second semiconductor layer 4. The second semiconductor layer 4 is formed on a circuit forming face (the face facing toward the first semiconductor layer 2) of the second substrate 3. The second chip C2 is a chip resulting from dicing a second wafer. The second substrate 3 is, for example, an Si substrate. The second semiconductor layer 4 includes a control circuit that controls reading, writing, and erasing to/from a memory cell. The memory cell array includes a plurality of memory strings. The memory cell array includes a stacked body formed by stacking electrode layers WL and insulating layers alternately. The stacked body is disposed on a back gate BG serving as a gate layer. Note that the number of the electrode layers WL illustrated in the figure is merely an example, and any number of the electrode layers WL may be used.

The back gate BG and the electrode layers WL are layers containing silicon as a main component. The back gate BG and the electrode layers WL further contain a dopant, such as boron, intended to give electrical conductivity to the silicon layers. The electrode layers WL may contain a metal silicide.

A single memory string is formed in, for example, a U-shape so as to include a pair of columnar portions CL extending in the direction along which the electrode layers WL are stacked and to include a joint connecting the pair of columnar portions CL at their respective ends. The columnar portion CL is formed in, for example, a cylindrical shape or an elliptic cylindrical shape, passes through the stacked body, and reaches the back gate BG.

A drain-side select gate is disposed at an upper end of one of the pair of columnar portions CL in the U-shaped memory string, while a source-side select gate is disposed at an upper end of the other one. The drain-side select gate and the source-side select gate are disposed on the uppermost layer of the electrode layers WL via an interlayer insulating layer.

In the staircase structure 96, ends of the individual electrode layers WL with respect to the X direction are formed in a staircase shape. In the staircase structure 96, there are disposed contact plugs 61 connected to the individual electrode layers WL formed in a staircase shape. The contact plugs 61 pass through the interlayer insulating layer 69 to be connected to the individual electrode layers WL formed in a staircase shape.

In the staircase structure 96, the back gate BG is connected to a contact plug 63. Select gates SG (the drain-side select gate and the source-side select gate) are connected to a contact plug 65.

The contact plugs 61 connected to the electrode layers WL are connected to word interconnection layers 62. The contact plug 63 connected to the back gate BG is connected to a back gate interconnection layer 64. The contact plug 65 connected to the select gates SG is connected to a select gate interconnection layer 66.

The word interconnection layers 62, the back gate interconnection layer 64, and the select gate interconnection layer 66 are disposed in the same layer. A source line (not shown in the figure) is also disposed in the same layer where the word interconnection layers 62, the back gate interconnection layer 64, and the select gate interconnection layer 66 are disposed.

The word interconnection layers 62, the back gate interconnection layer 64, the select gate interconnection layer 66, and the source line SL are formed by patterning the same material layer (a metal layer, for example). Therefore, the word interconnection layers 62, the back gate interconnection layer 64, the select gate interconnection layer 66, and the source line SL are simultaneously formed of the same material in the same layer into the same thickness.

The word interconnection layers 62 are further connected, via other plugs and other interconnection layers, to surface layer interconnection layers 73 formed on a face of the first semiconductor layer 2, the face being to be bonded to the second semiconductor layer 4.

The back gate interconnection layer 64, the select gate interconnection layer 66, and the source line SL are also connected to the surface layer interconnection layers 73 via other plugs and other interconnection layers.

Channel bodies of the columnar portions CL and bit lines BL are connected via plugs 67, and the bit lines BL are further connected to the surface layer interconnection layers 73 via other plugs and other interconnection layers.

The first chip C1 includes a memory-side interconnection layer intended to electrically connect the memory cell array and the second chip C2. The memory-side interconnection layer is formed to be a multi-layer interconnection that includes the aforementioned word interconnection layers 62, back gate interconnection layer 64, select gate interconnection layer 66, surface layer interconnection layers 73, and others.

The surface layer interconnection layers 73 are connected to circuit-side interconnection layers 76 in the second chip C2 via bonding metals 74a and 74b. The second chip C2 includes the second substrate 3. The second substrate 3 is, for example, a silicon substrate.

The control circuit in the second semiconductor layer 4 is formed as a semiconductor integrated circuit including a transistor 77. The transistor 77 has, for example, a metal-oxide-semiconductor field-effect transistor (MOSFET) structure including a gate electrode 78 and source/drain regions. The source/drain regions in the MOSFET are connected to the circuit-side interconnection layers 76 via plugs 79.

The circuit-side interconnection layers 76 are formed as a multi-layer interconnection on the circuit forming surface via an interlayer insulating layer 80.

The bonding metals 74a and 74b are disposed between the surface layer interconnection layers 73 of the first semiconductor layer 2 and the interconnection layers 76, which are included in the circuit-side interconnection layers 76 in the second semiconductor layer 4 and are closest to the first semiconductor layer 2. The bonding metals 74a and 74b are, for example, copper or copper alloys containing copper as a main component. The bonding metals 74a and 74b are provided by integrating bonding metals on the first wafer W1 and the second wafer W2 through annealing when the wafers are stuck together. Before the wafers are stuck together, an insulating film 75 and a precursor of the bonding metals 74a and 74b are disposed on each of the first wafer W1 and the second wafer W2.

The surface layer interconnection layers 73 of the first semiconductor layer 2 and the uppermost layer in the circuit-side interconnection layers 76 of the second semiconductor layer 4 are bonded to the bonding metals 74a and 74b. The insulating film 75 is disposed around the bonding metals 74a and 74b between the first semiconductor layer 2 and the second semiconductor layer 4. The insulating film 75 is a resin film or an inorganic film.

The first chip C1 and the second chip C2 are stuck together via the bonding metals 74a and 74b and the insulating film 75. The memory-side interconnection layer 73 of the first semiconductor layer 2 and the circuit-side interconnection layer 76 of the second semiconductor layer 4 are electrically connected via the bonding metals 74a and 74b.

Accordingly, the memory cell array is connected to the control circuit in the second semiconductor layer 4 via the memory-side interconnection layers 73, the bonding metals 74a and 74b, and the circuit-side interconnection layers 76.

According to the embodiment, the redistribution layer RDL including an insulating film 11 and interconnection layers 12 is disposed on the first substrate 1 side. The redistribution layer RDL is electrically connected to the first semiconductor layer 2 and/or the second semiconductor layer 4. The interconnection layer 12 has a pad (not shown in the figure) provided on a surface side of the semiconductor device 100, the pad being electrically connectable to the outside. The redistribution layer RDL is connected to the first semiconductor layer 2 and/or the second semiconductor layer 4 via, for example, a through-hole electrode (not shown in the figure) passing through the first substrate 1.

A plurality of bonding metals 74a and 74b is disposed in a bonding portion between the first semiconductor layer 2 and the second semiconductor layer 4. The plurality of bonding metals 74a and 74b mainly includes a plurality of bit-line lead-out portions 74a and a plurality of word-line lead-out portions 74b, the bit-line lead-out portions 74a being electrically connected to the bit lines BL and the word-line lead-out portions 74b being electrically connected to the electrode layers WL.

The bit-line lead-out portions 74a are disposed in a region overlapping, seen in the stacking direction, the memory cell array region in which the plurality of memory strings is disposed.

The word-line lead-out portions 74b are disposed in a region overlapping, seen in the stacking direction, a region in which the staircase structure 96 and others are formed outside the memory cell array region. In FIG. 1, the plurality of word-line lead-out portions 74b is disposed in a lower region and a lower right region relative to the staircase structure 96.

The method for manufacturing the semiconductor device 100 will now be described with reference to the flowchart in FIG. 2 and the process step cross-sectional views in FIGS. 3 to 9.

As shown in the flowchart in FIG. 2, the method for manufacturing the semiconductor device 100 includes the step of forming slits in the first wafer W1 (S01), the step of forming slits in the second wafer W2 (S02), the step of sticking the first wafer W1 and the second wafer W2 together (S03), the step of thinning a substrate (S04), the step of forming interconnections on the thinned substrate (S05), and the step of dicing (S06).

Figure 3:
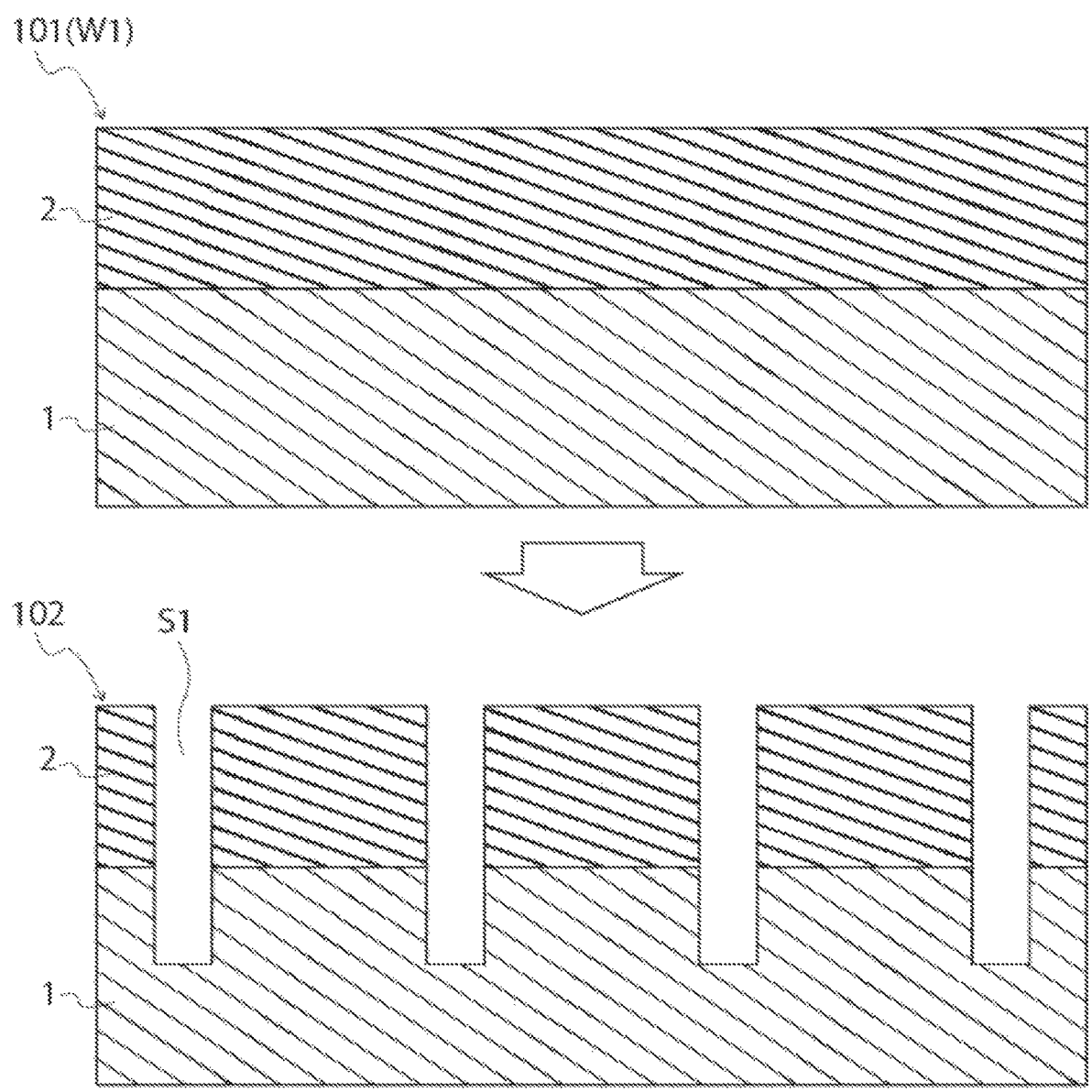
FIG. 3 is a process step cross-sectional view of a semiconductor device according to an embodiment.

The following describes the step of forming slits in the first wafer W1 (S01) referring to the process step cross-sectional view in FIG. 3. With reference to the process step cross-sectional view in FIG. 3, in the unprocessed first wafer W1 (101) as shown in the upper part of the figure, slits S1 are formed to provide the first wafer W1 (102) in which the slits S1 have been formed as shown in the lower part of the figure. The slits S1 are formed in a direction from a surface of the first wafer W1 on the first semiconductor layer 2 side toward the first substrate 1, without passing through the first substrate 1. It is preferable that the slits S1 are formed in at least part of the first semiconductor layer 2 and the slits reach the substrate 1 of the first wafer W1, which tends to warp because the first semiconductor layer 2 is thick. While the second semiconductor layer 4 having a control circuit formed therein typically has a thickness of 3 μm or less, the first semiconductor layer 2 has a thickness equal to or greater than 5 μm and equal to or less than 30 μm. Because the first semiconductor layer 2 is thicker, there is a greater possibility that contraction stress is caused in the first substrate 1 and warpage (including twisting) occurs in the first wafer 1. The slits S1 formed in the first wafer W1, or more preferably the slits S1 formed to reach the first substrate 1, are capable of relieving the contraction stress to lessen the warpage of the first wafer W1. The slits S1 are formed to be spaced at regular intervals in accordance with the size of the first chip C1.

It is preferable that the slits S1 are formed by using at least one method selected from the group consisting of blade dicing, laser dicing, dry etching, and wet etching. In the case of using blade dicing to form the slits S1, when the slits S1 reaching the first substrate 1 are formed, which means when the blade is used for cutting the hard first substrate 1, the blade provides its self-edging function, with the result that chipping and peeled films are reduced.

Since the slits S1 are formed prior to sticking the wafers together, an inspection can be carried out to check if, for example, any chipping or peeled films are caused by forming the slits S1. If any item is judged as defective during the inspection, the item can be removed as a defective item from products after all the steps are completed.

Figure 4:
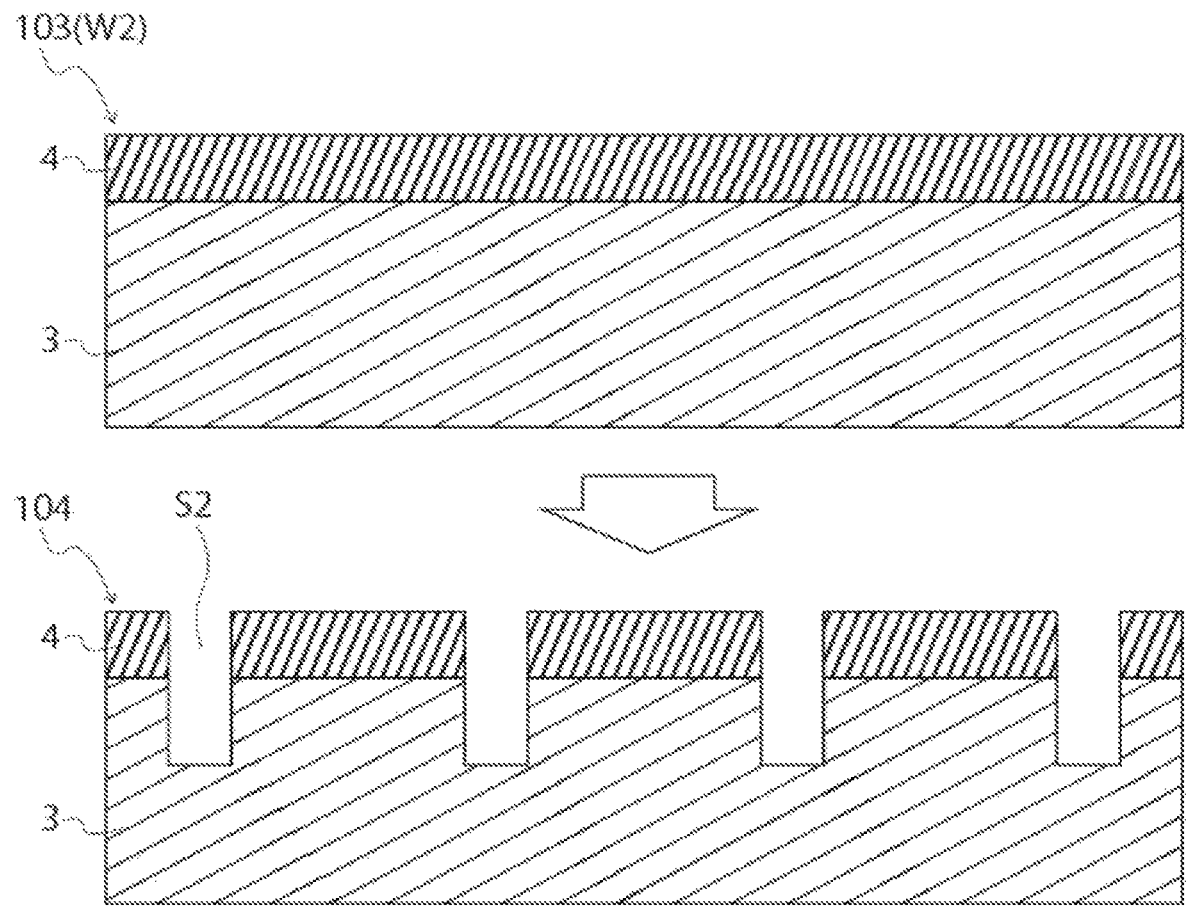
FIG. 4 is a process step cross-sectional view of a semiconductor device according to an embodiment.

The following describes the step of forming slits in the second wafer W2 (S02) referring to the process step cross-sectional view in FIG. 4. With reference to the process step cross-sectional view in FIG. 4, in the unprocessed second wafer W2 (103) as shown in the upper part of the figure, slits S2 are formed to provide the second wafer W2 (104) in which the slits S2 have been formed as shown in the lower part of the figure. The slits S2 are formed in a direction from a surface of the second wafer W2 on the second semiconductor layer 4 side toward the second substrate 3, without passing through the second substrate 3. The slits S2 are formed in at least part of the second semiconductor layer 4. If the second semiconductor layer 4 creates contraction stress in the second substrate 3 to cause the second wafer W2 to warp, forming the slits S2 that reach the second substrate 3 can relieve the contraction stress to lessen the warpage of the second wafer W2. The slits S2 are formed to be spaced at regular intervals in accordance with the size of the second chip C2. In view of sticking the wafers together, the slits S2 are spaced preferably at the same intervals as the slits S1 in the first wafer W1. The slits S1 in the first wafer W1 may not necessarily have the same width as the width of the slits S2 in the second wafer W2.

As with the slits S1, the slits S2 are preferably formed by using at least one method selected from the group consisting of blade dicing, laser dicing, dry etching, and wet etching.

Since the slits S2 are formed prior to sticking the wafers together, an inspection can be carried out to check if, for example, any chipping or peeled films are caused by forming the slits S2. If any item is judged as defective during the inspection, the item can be removed as a defective item from products after all the steps are completed.

Figure 5:
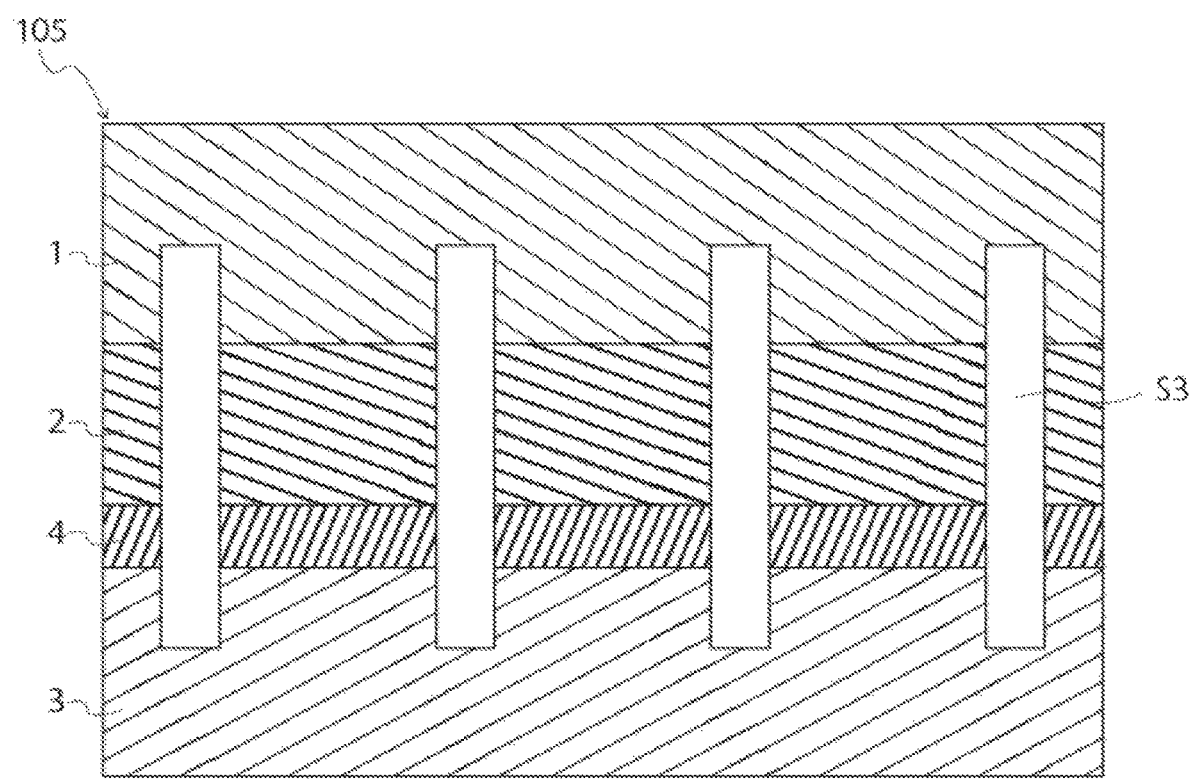
FIG. 5 is a process step cross-sectional view of a semiconductor device according to an embodiment.

The following describes the step of sticking the first wafer W1 and the second wafer W2 together (S03) referring to the process step cross-sectional view in FIG. 5. As illustrated in the process step cross-sectional view in FIG. 5, the first wafer W1 and the second wafer W2 are stuck together to provide a wafers-stuck member 105 in which the first wafer W1 and the second wafer W2 are stuck together. The first semiconductor layer 2 side of the first wafer W1 is stuck to the second semiconductor layer 4 side, that is, the circuit side of the second wafer W2. The first wafer W1 and the second wafer W2 are stuck together so that the slits S1 of the first wafer W1 and the slits S2 of the second wafer W2 face each other. As a result of sticking the wafers together, the slit S1 in the first wafer W1 and the slit S2 in the second wafer W2 are integrated into a slit S3. The wafers are stuck together preferably under a reduced-pressure environment compared with atmospheric pressure for reasons of, for example, ensuring that air is not left between the first wafer W1 and the second wafer W2.

In the step of sticking the wafers together, a void may be created when air remains between the wafers. The manufacturing method according to the embodiment includes forming the slits S1 and S2 in the wafers. These slits S1 and S2 serve as paths for discharging air, and thus air is less likely to remain between the first semiconductor layer 2 and the second semiconductor layer 4. If air remains, a void may be created to cause the wafers to be improperly stuck, with the result that the semiconductor device 100 obtained by dicing the wafers may include a defect. In addition, even when the first wafer W1 is significantly warped before the slits S1 are formed, the first wafer W1 becomes less warped due to the slits S1 formed therein. Therefore, in the step of sticking the first wafer W1 and the second wafer W2 together, faces of the first semiconductor layer 2 and the second semiconductor layer 4 are allowed to come in contact with each other with higher precision. The wafers stuck together are then subjected to an annealing process, whereby the bonding metal on the first semiconductor layer 2 on a surface opposite to the first substrate 1 and the bonding metal on the second semiconductor layer 4 on a surface opposite to the second substrate 3 are integrated together through thermal expansion and thermal diffusion, and the first semiconductor layer 2 and the second semiconductor layer 4 are electrically connected. If the wafers are greatly warped, the bonding metals on the respective semiconductor layers may be difficult to approach each other in accordance with a design and may be difficult to be integrated with each other. In the embodiment, however, the first wafer W1 and the second wafer W2 can be stuck together with higher precision, and thus reliability of such electrical connection can be improved, which contributes to improved yields.

Figure 6:
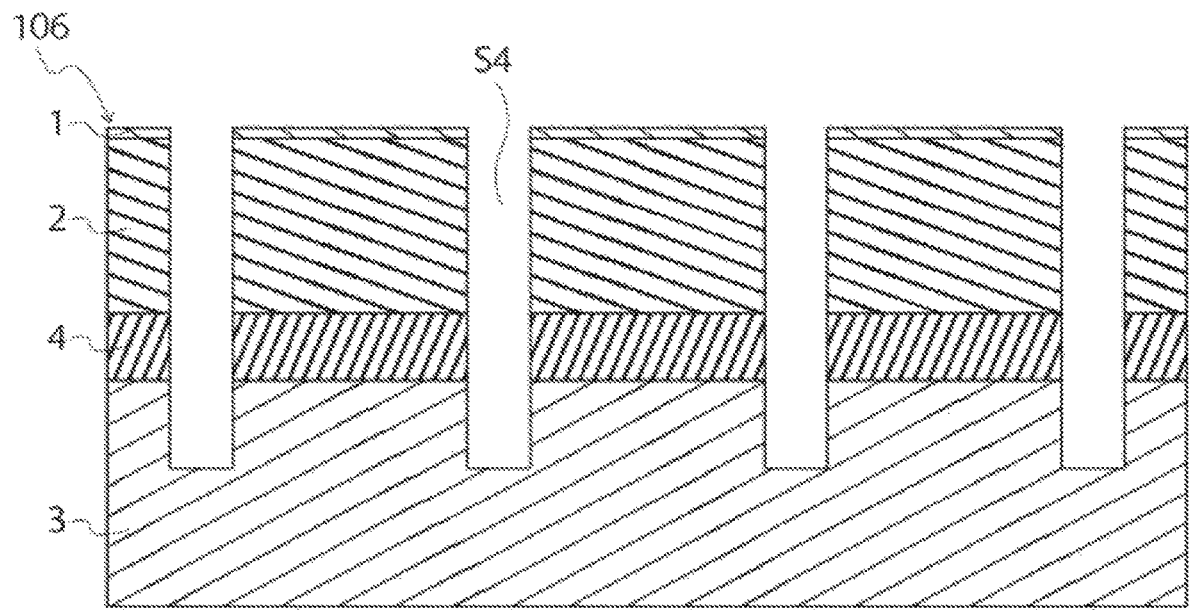
FIG. 6 is a process step cross-sectional view of a semiconductor device according to an embodiment.

The following describes the step of thinning a substrate (S04) referring to the process step cross-sectional view in FIG. 6. In the step of thinning a substrate (S04), the first substrate in the wafers-stuck member 105 is made thinner. As illustrated in the process step cross-sectional view in FIG. 6, the first substrate 1 in the wafers-stuck member 105 is thinned to provide a member 106 in which the first substrate 1 is made thinner. Note that the second substrate 3 may alternatively be thinned. In the case of thinning the second substrate 3, interconnections are formed on the second substrate 3 side. The first substrate 1 is thinned such that, for example, the slits S3 become open (open slits S4). Thinning the first substrate 1 makes it easier to form, from the first substrate 1 side, interconnections that electrically connect to the first semiconductor layer 2 and to the second semiconductor layer 4. In addition, thinning the substrate reduces the thickness of the obtained semiconductor device 100. The substrate can be made thinner by grinding or slicing the substrate. The substrate may be thinned by e.g., wet-etching and dry-etching.

Figure 7:
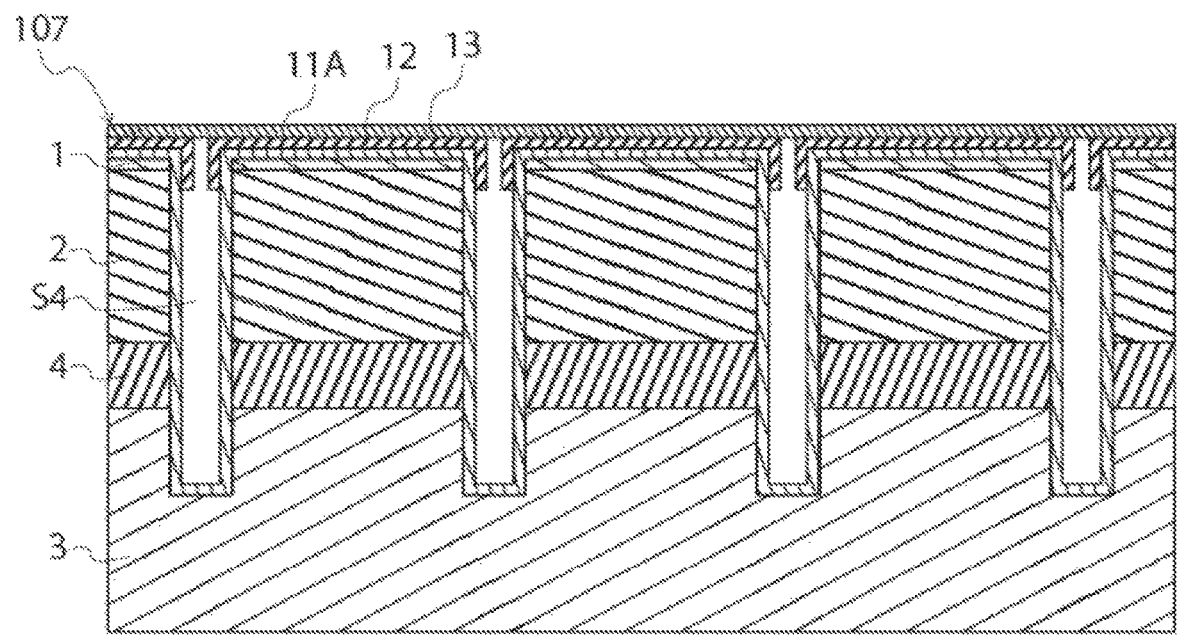
FIG. 7 is a process step cross-sectional view of a semiconductor device according to an embodiment.
Figure 8:
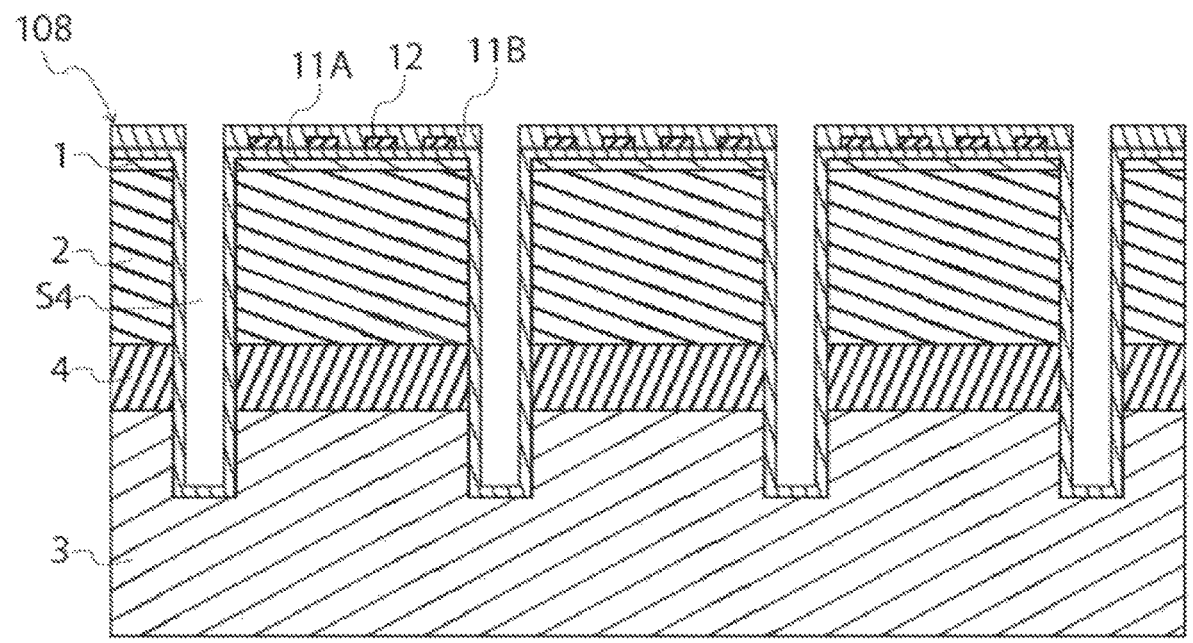
FIG. 8 is a process step cross-sectional view of a semiconductor device according to an embodiment.

The following describes the step of forming interconnections on the thinned substrate (S05) referring to the process step cross-sectional views in FIGS. 7 and 8. First, as illustrated in the process step cross-sectional view in FIG. 7, an insulating film 11A is formed on a surface of the thinned substrate (the first substrate 1) and on the inside of the slits S4. The insulating film 11A can be opened by patterning using photosensitive resin formed on the insulating film 11A. When the insulating film 11A is formed by e.g. chemical vapor deposition (CVD), openings of the insulating film 11A can be formed by photolithography. The opening for through etching of the first substrate 1 is then formed, the opening contacts electrically with the first semiconductor layer 2. After that, a via hole through the first substrate 1 is formed, and part of the first semiconductor layer 2 or the second semiconductor layer 4 is exposed. Thereafter a metal film 12 is then formed. And, a resist 13 serving as a mask is formed on the metal film 12, whereby a member 107 is obtained. In some cases, the insulating film 11A may be formed on part of the inside of the slits S4. Using a dry film resist or the like as the resist 13 to block the openings of the slits S4 makes it easier to do patterning of the metal film 12. Then, as illustrated in the process step cross-sectional view in FIG. 8, the metal film 12 is turned into interconnection layers 12 as a result of patterning the metal film 12, and an insulating film 11B is further formed, whereby a member 108 having interconnections formed therein is obtained. The interconnection layers 12 are electrically connected to the first semiconductor layer 2 and to the second semiconductor layer 4 via an interconnection (not shown in the figure) passing through the first substrate 1. The insulating film 11A and the insulating film 11B can be handled as an insulating film 11. The method illustrated in FIGS. 7 and 8 is merely an example method for forming interconnections on the thinned substrate, and other methods may be used to form the interconnections. The interconnection layer 12 may be stacked layers of one or more conductive layers and one or more insulating layers.

Figure 9:
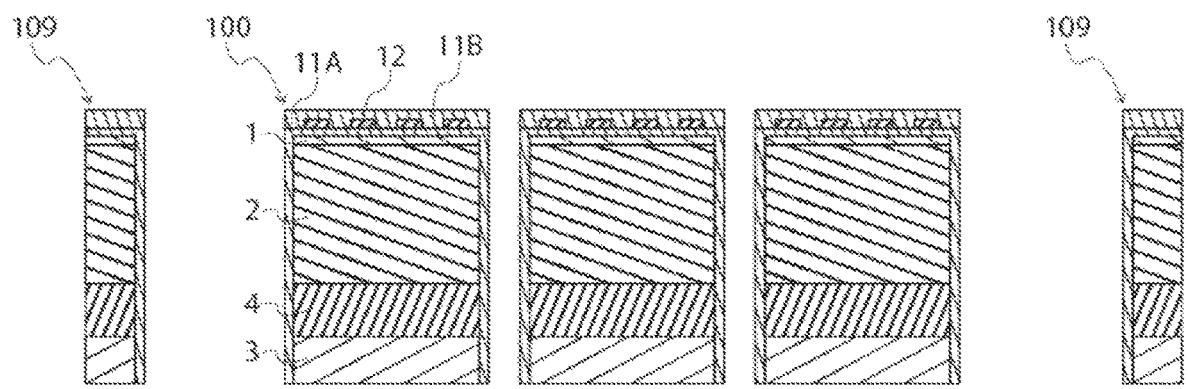
FIG. 9 is a process step cross-sectional view of a semiconductor device according to an embodiment.

The following describes the step of dicing (S06) referring to the process step cross-sectional view in FIG. 9. As illustrated in the process step cross-sectional view in FIG. 9, the member 108 in which interconnections are formed in accordance with the positions of the slits S4 is diced, whereby the semiconductor device 100 is obtained. The member 109 obtained at an end may be invalid or may be the valid semiconductor device 100. For dicing, the second substrate 3 is ground or sliced so that the member 108 is separated into pieces including interconnections formed therein with the slits serving as boundaries. The thickness of the second substrate 3 in the semiconductor device 100 can be controlled on the basis of the depth of the slits S2 in the second wafer W2. Because slit formation is not carried out during dicing, stress is less likely to be caused in the bonding interface between the first wafer W1 and the second wafer W2 during dicing, and thus peeling and cracks are less likely to occur, which contributes to improved yields.

Second Embodiment

Figure 10:
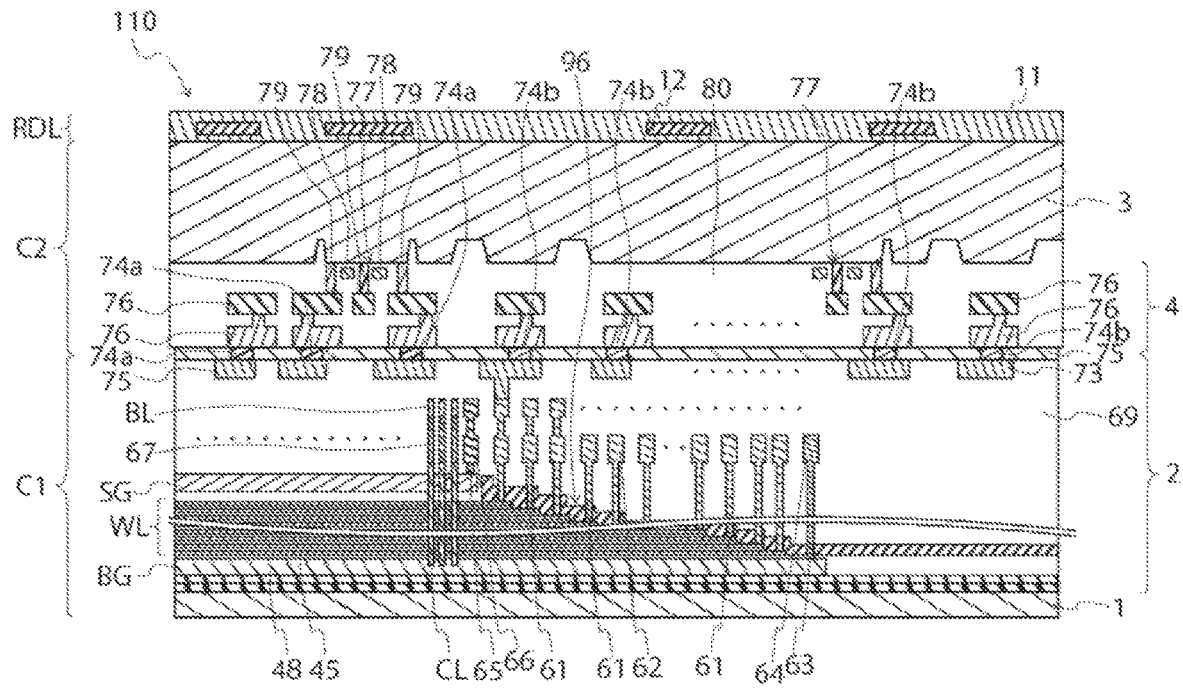
FIG. 10 is a cross-sectional view of a semiconductor device according to an embodiment.
Figure 11:
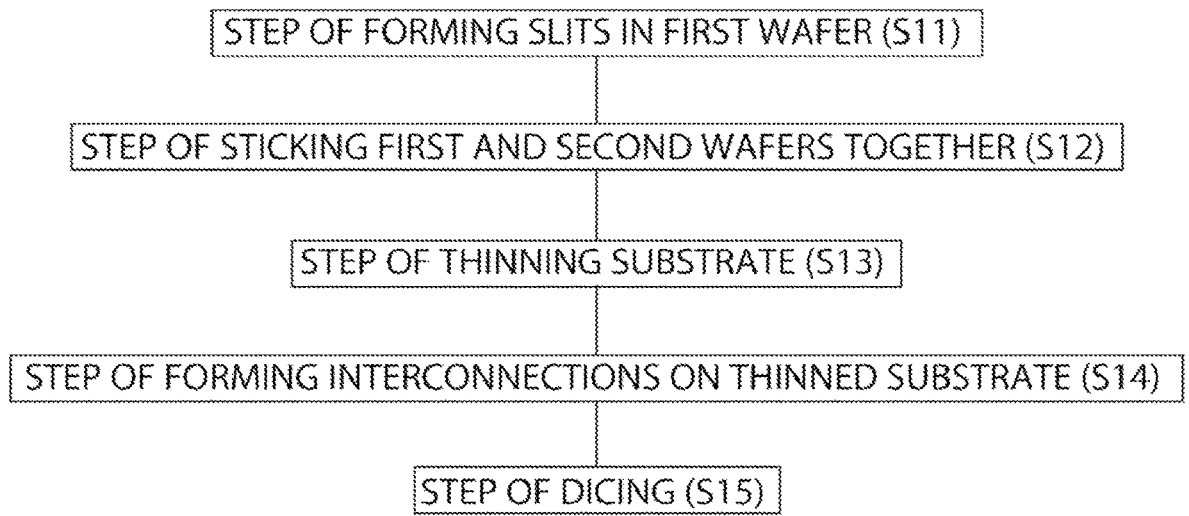
FIG. 11 is a flowchart for a semiconductor device according to an embodiment.

A second embodiment relates to a method for manufacturing a semiconductor device. FIG. 10 is a cross-sectional view of a semiconductor device 110. FIG. 11 is a flowchart illustrating the method for manufacturing the semiconductor device 110 according to the second embodiment. FIGS. 12 to 16 are process step cross-sectional views illustrating the method for manufacturing the semiconductor device 110. The semiconductor device 110 and the method for manufacturing the semiconductor device 110 according to the second embodiment are modifications of the semiconductor device 100 and the method for manufacturing the semiconductor device 100 according to the first embodiment.

The cross-sectional view in FIG. 10 shows a main portion of part of the semiconductor device 110. The semiconductor device 110 in FIG. 10 is an example of a memory device. The semiconductor device 110 is manufactured by the method for manufacturing the semiconductor device 110 according to the embodiment. The semiconductor device includes a first chip C1, a second chip C2, and a redistribution layer RDL. The semiconductor device 110 according to the second embodiment is in common with the semiconductor device 100 according to the first embodiment except that the redistribution layer RDL is disposed on the second substrate 3 in the second chip on the side opposite to the second semiconductor layer 4. In the second embodiment, descriptions about configurations, effects, and other things in common between the first and second embodiments are omitted. A configuration of the semiconductor device 110 will now be described; however, the method for manufacturing the semiconductor device 110 can be implemented without being limited to the semiconductor device 110 configured to include a first semiconductor layer 2 and a second semiconductor layer 4.

The method for manufacturing the semiconductor device 110 will now be described with reference to the flowchart in FIG. 11 and the process step cross-sectional views in FIGS. 12 to 16.

As shown in the flowchart in FIG. 11, the method for manufacturing the semiconductor device 110 includes the step of forming slits in the first wafer W1 (S11), the step of sticking the first wafer W1 and the second wafer W2 together (S12), the step of thinning a substrate (S13), the step of forming interconnections on the thinned substrate (S14), and the step of dicing (S15).

The step of forming slits in the first wafer W1 (S11) is in common with the step of forming slits in the first wafer W1 (S01) according to the first embodiment. In the second embodiment, the process of forming slits in the second wafer W2 prior to sticking the first wafer W1 and the second wafer W2 together is not performed. Since the second semiconductor layer 4 in the second wafer W2 is not very thick, the second wafer W2 creates low compressional stress, and therefore reducing the warpage of the first wafer W1 can improve yields.

Figure 12:
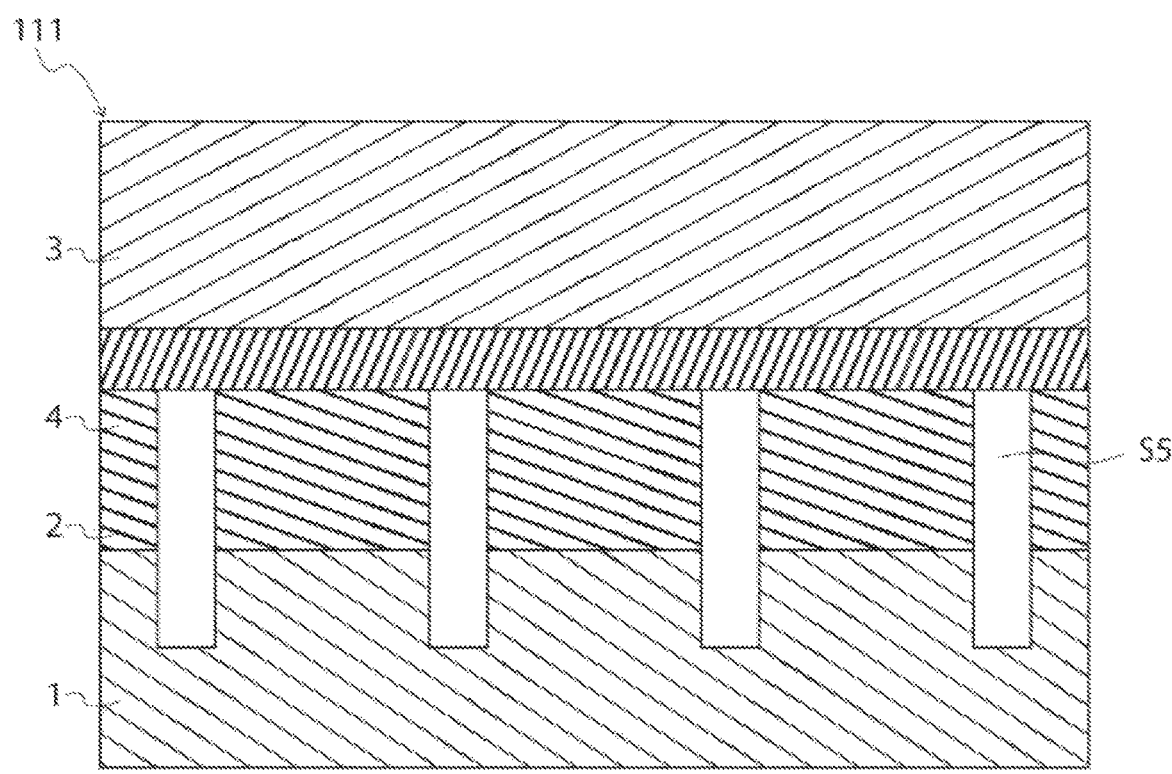
FIG. 12 is a process step cross-sectional view of a semiconductor device according to an embodiment.

The following describes the step of sticking the first wafer W1 and the second wafer W2 together (S12) referring to the process step cross-sectional view in FIG. 12. As illustrated in the process step cross-sectional view in FIG. 12, the first wafer W1 and the second wafer W2 are stuck together to provide a wafers-stuck member 111 in which the first wafer W1 and the second wafer W2 are stuck together. As a result of sticking the wafers together, the slits S1 in the first wafer W1 are turned into slits S5 covered by the second wafer W2. The operation is performed preferably under a reduced pressure environment compared with atmospheric pressure.

In the step of sticking the wafers together, the slits S1 in the first wafer W1 serve as paths for discharging air, and thus air is less likely to remain between the first semiconductor layer 2 and the second semiconductor layer 4. Because the warpage is mitigated although slits are made in either one of the wafers, and because the slits serve as paths for discharging air, the wafers are stuck together under conditions that ensure voids are less likely to be created.

Figure 13:
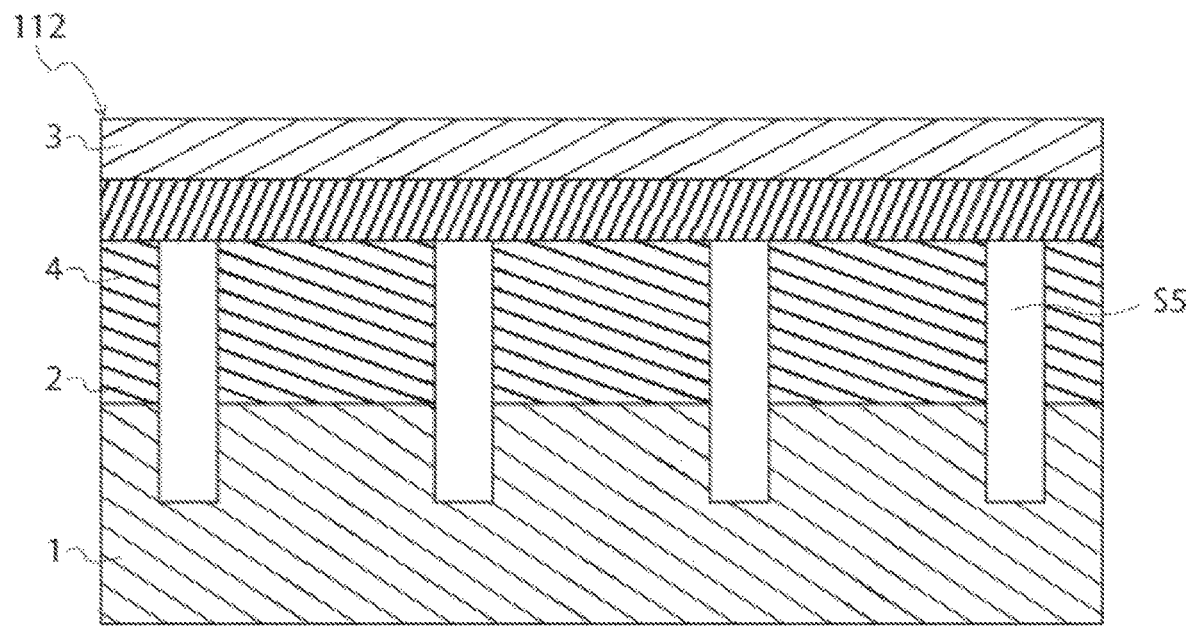
FIG. 13 is a process step cross-sectional view of a semiconductor device according to an embodiment.

The following describes the step of thinning a substrate (S13) referring to the process step cross-sectional view in FIG. 13. In the step of thinning a substrate (S13), the second substrate 3 in the wafers-stuck member 111 is made thinner. As illustrated in the process step cross-sectional view in FIG. 13, the second substrate 3 is thinned to provide a member 112 in which the second substrate 3 is made thinner. Because the second substrate 3, which has no slit S5 formed therein, is made thinner, the slits S5 are not open after the second substrate 3 is thinned. Thinning the second substrate 3 side makes it easier to form interconnections passing through the second substrate 3 and reduces the thickness of the obtained semiconductor device 110. Note that the first substrate 1 may alternatively be thinned. In the case of thinning the first substrate 1, interconnections are formed on the first substrate 1 side. In the case of thinning the first substrate 1, interconnections are formed by using a method similar to the method for forming interconnections according to the first embodiment.

Figure 14:
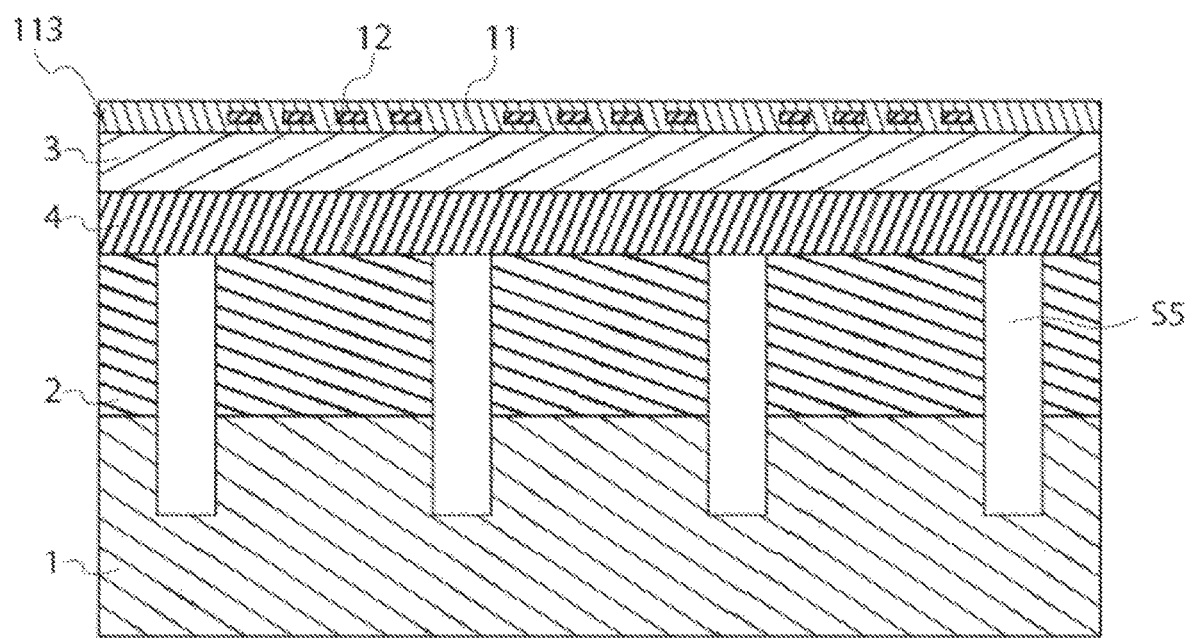
FIG. 14 is a process step cross-sectional view of a semiconductor device according to an embodiment.

The following describes the step of forming interconnections on the thinned substrate (S14) referring to the process step cross-sectional view in FIG. 14. As illustrated in the process step cross-sectional view in FIG. 14, interconnections including an insulating film 11 and interconnection layers 12 are formed on the thinned second substrate 3 on a surface opposite to the second semiconductor layer 4 side, whereby a member 113 in which interconnections are formed on the thinned substrate is obtained. For forming interconnections according to the second embodiment, the interconnections are formed on the second substrate 3, which has no slit S5 formed therein, and therefore a general resist can be used without forming a dry film resist.

Figure 15:
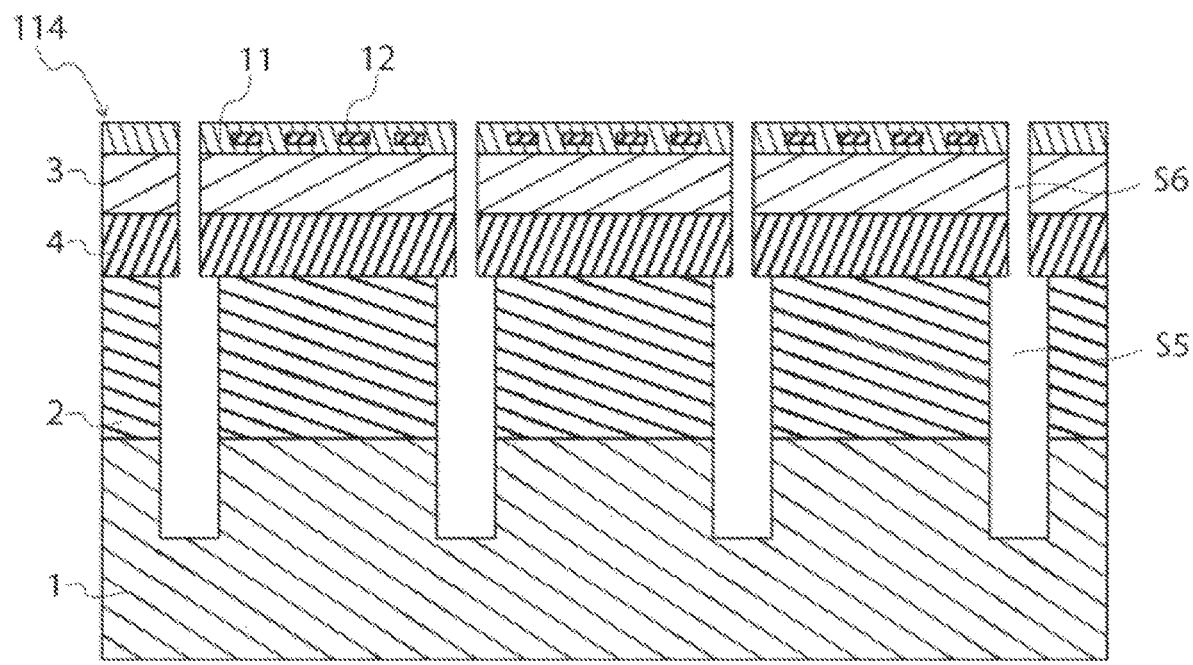
FIG. 15 is a process step cross-sectional view of a semiconductor device according to an embodiment.
Figure 16:
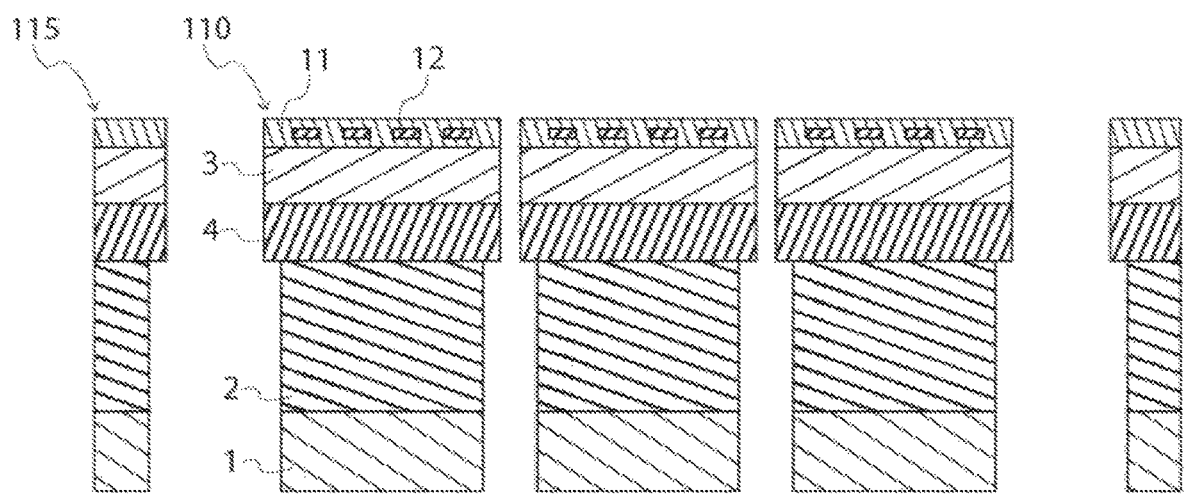
FIG. 16 is a process step cross-sectional view of a semiconductor device according to an embodiment.

The following describes the step of dicing (S15) referring to the process step cross-sectional views in FIGS. 15 and 16. In the step of dicing (S15), the member 113 in which interconnections are formed in accordance with the positions of the slits S5 is diced. As illustrated in the process step cross-sectional view in FIG. 15, first, the second wafer W2 is cut in accordance with the positions of the slits S5 to form cut holes S6 joined to the slits S5, whereby a member 114 in which the cut holes S6 are formed in the second wafer W2 is obtained. The cut holes S6 can be made by using a method similar to the method for forming the slits S1. The width of the cut hole S6 may be narrower than, equal to, or greater than the width of the slit S5. While the first semiconductor layer 2 is thick and thus difficult to cut or form slits therein, the second semiconductor layer 4 has a smaller thickness. Therefore, in spite of cutting the second semiconductor 4 after the first wafer W1 and the second wafer W2 are stuck together, it is less likely that stress is caused in the bonding portion therebetween or that the stuck member of the first wafer W1 and the second wafer is peeled. Then, as illustrated in the process step cross-sectional view in FIG. 16, the first substrate 1 is thinned and the member 113 in which interconnections are formed (the member 114 in which the cut holes are formed) is diced, whereby the semiconductor device 110 is obtained. The member 115 obtained at an end may be invalid or may be the valid semiconductor device 110. Because slit formation is not carried out during dicing, stress is less likely to be caused in the bonding interface between the first wafer W1 and the second wafer W2 during dicing, and thus peeling and cracks are less likely to occur, which contributes to improved yields.

In the first embodiment and the second embodiment the first substrate 1 and the second substrate 3 is thinned, however these substrates can be removed. In this case, the semiconductor devices 100, 101 can be thinner and can be smaller.

In the first embodiment, when the first substrate 1 and the second substrate 3 are thinned, the slits of the first substrate 1 and the second substrate 3 are exposed to the outside, these substrates cam be thinned so that the slits are not exposed to the outside. In this case, the interconnection layer 12 can be easily formed because the slits are not exposed to the outside when the interconnection layer 12 is formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, the method comprising:
   forming a slit in a first device layer which is formed on a first wafer;
   sticking the first wafer and a second wafer on which a second device layer which is formed so that the first device layer and the second device layer face each other, to form a hollow groove in the first device layer, the hollow groove including the slit of the first device layer;
   thinning the first wafer or the second wafer of a member obtained by the sticking;
   forming an interconnection on a face of the wafer that is thinned; and
   dicing a member on which the interconnection is formed through the hollow groove.

2. The method according to claim 1, wherein
   the first device layer comprises a memory cell array that includes a plurality of memory cells, and
   the second device layer comprises a control circuit for the memory cells.

3. The method according to claim 1, the method further comprising:
   forming a slit in the second device layer prior to the sticking, wherein the first wafer is thinned during the thinning of the wafer.

4. The method according to claim 3, wherein
   during the sticking, the first slit and the second slit form the hollow groove, wherein the hollow groove is formed in the first device layer and the second device layer.

5. The method according to claim 1, wherein
   the slit is formed by at least one method selected from the group consisting of: blade dicing, laser dicing, dry etching, wet etching.

6. The method according to claim 1, wherein
   during the dicing, a side surface of the hollow groove is exposed to a cut member.

7. The method according to claim 1, wherein
   the interconnection connects electrically to the first device layer or the second device layer.

8. The method according to claim 1, wherein
   during the thinning, the hollow groove is exposed to an outside from a face of a thinned wafer.

9. The method according to claim 1, wherein
   during the dicing, the member on which the interconnection is formed is thinned from a face which is opposite to a face on which the interconnection is formed to the hollow groove.

10. The method according to claim 1, wherein
    during the dicing, the member on which the interconnection is formed is thinned from a face which is opposite to a face on which the interconnection is formed to the hollow groove, and
    during the dicing the member on which the interconnection is formed is separated into pieces including the interconnection formed therein with the hollow groove serving as boundaries.

11. A method for manufacturing a semiconductor device, the method comprising:
    forming a slit in a first device layer which is formed on a first substrate;
    sticking the first substrate and a second substrate on which a second device layer which is formed so that the first device layer and the second device layer face each other, and to form a hollow groove in the first device layer, the hollow groove including the slit of the first device layer;
    thinning the first substrate or the second substrate of a member obtained by the sticking;
    forming an interconnection on a face of the substrate that is thinned; and
    dicing a member on which the interconnection is formed through the hollow groove.

12. The method according to claim 11, wherein
    during the dicing, the member on which the interconnection is formed is thinned from a face which is opposite to a face on which the interconnection is formed to the hollow groove.

13. The method according to claim 11, wherein
    during the dicing, the member on which the interconnection is formed is thinned from a face which is opposite to a face on which the interconnection is formed to the hollow groove, and
    during the dicing the member on which the interconnection is formed is separated into pieces including the interconnection formed therein with the hollow groove serving as boundaries.

14. The method according to claim 11, wherein
    during the thinning, the hollow groove is exposed to an outside from a face of a thinned substrate.

15. The method according to claim 11, wherein
    the first device layer comprises a memory cell array that includes a plurality of memory cells, and
    the second device layer comprises a control circuit for the memory cells.

16. The method according to claim 11, further comprising:
    forming a slit in the second device layer prior to the sticking, wherein
    the first substrate is thinned during the thinning of the substrate.

17. The method according to claim 16, wherein
    during the sticking, the first slit and the second slit form the hollow groove, wherein the hollow groove is formed in the first device layer and the second device layer.

18. The method according to claim 11, wherein
    the slit is formed by at least one method selected from the group consisting of: blade dicing, laser dicing, dry etching, wet etching.

19. The method according to claim 11, wherein
    during the dicing, a side surface of the hollow groove is exposed to a cut member.

20. The method according to claim 11, wherein
    the interconnection connects electrically to the first device layer or the second device layer.

* * * * *